United States Patent
Kafal et al.

(10) Patent No.: US 11,333,699 B2
(45) Date of Patent: May 17, 2022

(54) METHOD FOR CHARACTERISING A FAULT IN A TRANSMISSION LINE NETWORK WITH UNKNOWN TOPOLOGY

(71) Applicant: COMMISSARIAT A L'ENERGIE ATOMIQUE ET AUX ENERGIES ALTERNATIVES, Paris (FR)

(72) Inventors: Moussa Kafal, Les Ulis (FR); Wafa Ben Hassen, Paris (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/253,099

(22) PCT Filed: Jun. 11, 2019

(86) PCT No.: PCT/EP2019/065108
§ 371 (c)(1),
(2) Date: Dec. 16, 2020

(87) PCT Pub. No.: WO2020/001966
PCT Pub. Date: Jan. 2, 2020

(65) Prior Publication Data
US 2021/0278452 A1 Sep. 9, 2021

(30) Foreign Application Priority Data
Jun. 26, 2018 (FR) ...................................... 1855696

(51) Int. Cl.
*G01R 31/11* (2006.01)
*G01R 31/08* (2020.01)

(52) U.S. Cl.
CPC ............ *G01R 31/11* (2013.01); *G01R 31/083* (2013.01); *G01R 31/088* (2013.01)

(58) Field of Classification Search
CPC ..... G01R 31/11; G01R 31/083; G01R 31/088
(Continued)

(56) References Cited

U.S. PATENT DOCUMENTS

| 7,282,922 B2 | 10/2007 | Lo et al. | |
| 2013/0173187 A1* | 7/2013 | Sommervogel | G01R 31/11 702/58 |
| 2015/0212139 A1* | 7/2015 | Smith | G01R 31/52 324/509 |

FOREIGN PATENT DOCUMENTS

| FR | 3 012 616 A1 | 5/2015 |
| WO | 2016/050547 A1 | 4/2016 |

(Continued)

OTHER PUBLICATIONS

Fletcher, "Practical methods of optimization", John Wiley & Sons, 2013.

*Primary Examiner* — Farhana A Hoque
(74) *Attorney, Agent, or Firm* — BakerHostetler

(57) ABSTRACT

A method for characterizing a fault in a transmission line network, the method includes the steps of: obtaining a first measured time reflectogram $R_m$ from a signal previously injected into the network, obtaining a second time reflectogram $R_s$ corresponding to the network in the absence of faults, determining the time difference $R_{ref}$ between the first measured time reflectogram $R_m$ and the second time reflectogram $R_s$, identifying, in the time difference $R_{ref}$ an amplitude peak characterizing the presence of a fault and its time abscissa indicating the position of the fault, simulating a plurality of time reflectogram hypotheses each corresponding to the network comprising a fault at the identified position, each hypothesis being associated with a different value of at least one parameter characteristic of the fault, selecting the time reflectogram hypothesis closest to the time difference $R_{ref}$.

13 Claims, 9 Drawing Sheets

(58) Field of Classification Search
USPC ......................................................... 324/512
See application file for complete search history.

(56) References Cited

FOREIGN PATENT DOCUMENTS

| WO | 2017/148753 A1 | 9/2017 |
| WO | 2017/174400 A1 | 10/2017 |
| WO | 2018/108526 A1 | 6/2018 |
| WO | 2019/030246 A1 | 2/2019 |

* cited by examiner

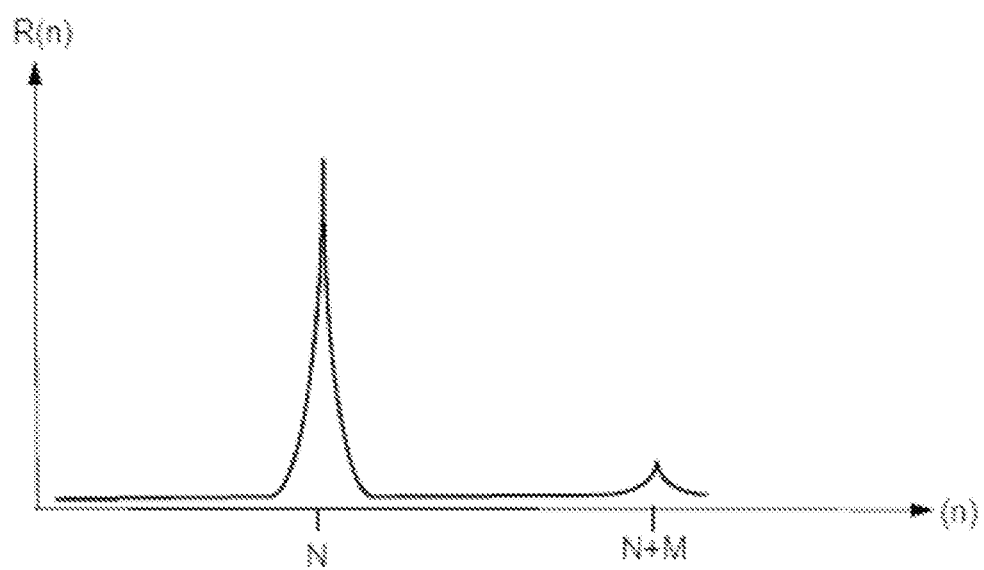
FIG.1bis

METHOD FOR CHARACTERISING A FAULT IN A TRANSMISSION LINE NETWORK WITH UNKNOWN TOPOLOGY

CROSS-REFERENCE TO RELATED APPLICATIONS

This application is a National Stage of International patent application PCT/EP2019/065108, filed on Jun. 11, 2019, which claims priority to foreign French patent application No. FR 1855696, filed on Jun. 26, 2018, the disclosures of which are incorporated by reference in their entirety.

FIELD OF THE INVENTION

The invention relates to the field of wire diagnostic systems based on the principle of reflectometry. Its subject is a method for characterizing a fault in a transmission line network, for example a cable network, of unknown topology.

BACKGROUND

The aim in characterizing a fault is more specifically to detect the existence of a fault at any point of the line network, to determine the position of the fault in the topology of the network, but also to determine parameters characteristic of the fault such as the length of the fault and its nature. The nature of a fault relates to the information concerning the predominant linear parameter of the fault. If the predominant linear parameter is the resistance of the fault, it is called resistive fault. If the predominant linear parameter is the conductance of the fault, it is called conductive fault. If the predominant linear parameter is the inductance of the fault, it is called inductive fault. If the predominant linear parameter is the capacitance of the fault, it is called capacitive fault. The invention also aims to determine the value of each linear parameter of the fault which can be expressed with respect to the reference value of this same parameter for the transmission line on which the fault exists.

Cables are omnipresent in all electrical systems, for power supply or information transmission purposes. These cables are subject to the same stresses as the systems that they link together and can be subject to failures. It is therefore necessary to be able to analyze their state and provide information on the detection of faults, but also the location and type thereof, in order to assist in maintenance. The standard reflectometry methods allow this type of testing.

The reflectometry methods use a principle similar to that of radar: an electrical signal, the probe signal or reference signal, which is most often of high frequency or wide band, is injected at one or more points of the cable to be tested. The signal is propagated in the cable or the network and returns a portion of its energy when it encounters an electrical discontinuity. An electrical discontinuity can result, for example, from a connection, from the end of the cable or a fault or, more generally, from a break in the conditions of propagation of the signal in the cable. It results most often from a fault which locally modifies the characteristic impedance of the cable by provoking a discontinuity in its linear parameters.

The analysis of the signals returned to the point of injection allows information to be deduced on the presence and the location of these discontinuities, and therefore of any fault. An analysis in the time or frequency domain is usually performed. These methods are referred to by the acronyms TDR, from the expression "Time Domain Reflectometry", and FDR, from the expression "Frequency Domain Reflectometry".

SUMMARY OF THE INVENTION

The invention falls within the scope of the reflectometry methods used for wire diagnostic purposes and applies to any type of electrical cable, in particular power transmission cables or communication cables, in fixed or mobile installations. The cables concerned can be coaxial, two-wire, in parallel lines, in twisted pairs or the like, provided that it is possible to inject a reflectometry signal therein at a point of the cable and to measure its reflection at the same point or at another point.

The known time reflectometry methods are particularly suited to detecting hard faults in a cable, such as a short circuit or an open circuit or, more generally, a local significant alteration of the impedance of the cable. The fault is detected by measuring the amplitude of the signal reflected on this fault which is all the greater, and therefore more detectable, when the fault is significant.

Conversely, a soft fault, for example resulting from a superficial degradation of the sheath of the cable, of the insulation or of the conductor, generates a peak of low amplitude on the reflected reflectometry signal and is consequently more difficult to detect by conventional temporal methods. More generally, a soft fault can be provoked by friction, a pinching, or even a phenomenon of corrosion which affects the sheath of the cable, the insulation or conductor.

The detection and location of a soft fault on a cable is a major problem for the industrial world because a fault generally appears first of all as a superficial fault but can, with time, evolve to a more impactful fault. For that reason in particular, it is useful to be able to detect the appearance of a fault as it appears and at a stage where its impact is superficial in order to anticipate its evolution to a more significant fault. Moreover, it is also important to know the nature of the fault detected and to characterize it by determining its predominant linear parameter because this information allows the degree of degeneration generated by the fault and the probable rate of transformation of the soft fault into a hard fault to be characterized. Indeed, a fault of resistive type leads to a faster degradation than a fault of inductive or capacitive type. That is due to the fact that the faults of resistive type result generally from a degradation of the conductor of the cable whereas the faults of inductive or capacitive type result rather from a superficial degradation of the insulation of the cable.

Another problem that the invention aims to resolve relates to the diagnostic testing of a wire network of unknown topology whose plans are not available or for which an emergency intervention requires immediate knowledge of the topology of the network. This type of problem exists notably for the electrical or power cable networks within a building or within a vehicle. A technician wanting to troubleshoot the network following the detection of an electrical problem may need an accurate knowledge of the topology of the network to assist him or her in arriving at his or her diagnosis. Moreover, some buildings have a level of confidentiality which prohibits, by its nature, the circulation of the drawings of the electrical network.

Thus, one problem to be resolved relates to the detection and characterization of soft faults in a cable network whose topology is not a priori known.

Another problem is specific to the field of the reflectometry methods applied to fault detection.

FIG. 1 represents a diagram of a system 100 for analyzing faults in a transmission line L, such as a cable, according to a standard time reflectometry method of the prior art. Such a system mainly comprises a generator GEN of a reference signal. The digital reference signal generated is converted to analog via a digital-analog converter DAC then is injected at a point of the transmission line L by means of a directional coupler CPL or any other device allowing a signal to be injected into a line. The signal is propagated along the line and is reflected on the singularities that it includes. In the absence of a fault on the line, the signal is reflected on the end of the line if the termination of the line is not matched. In the presence of a fault on the line, the signal is reflected partially on the impedance discontinuity provoked by the fault. The reflected signal is back-propagated to a measurement point, which can be the same as the point of injection or different. The back-propagated signal is measured via the directional coupler CPL then converted to digital by an analog-digital converter ADC. A correlation COR is then performed between the measured digital signal and a copy of the digital signal generated before injection in order to produce a time reflectogram R(t) corresponding to the intercorrelation between the two signals.

As is known in the field of time reflectometry diagnostic methods, the position $d_{DF}$ of a fault on the cable L, in other words its distance to the point of injection of the signal, can be directly obtained from the measurement, on the calculated time reflectogram R(t), of the time $t_{DF}$ between the first amplitude peak recorded on the reflectogram and the amplitude peak corresponding to the signature of the fault.

FIG. 1*bis* represents an example of reflectogram R(n) obtained using the system of FIG. 1, on which a first amplitude peak is observed at an abscissa N and a second amplitude peak is observed at an abscissa N+M. The first amplitude peak corresponds to the reflection of the signal at the point of injection into the cable, whereas the second peak corresponds to the reflection of the signal on an impedance discontinuity provoked by a fault.

Various known methods can be envisaged to determine the position $d_{DF}$. A first method consists in applying the relationship linking distance and time: $d_{DF}=V_g \cdot t_{DF}/2$, in which $V_g$ is the speed of propagation of the signal in the cable. Another possible method consists in applying a proportionality relationship of the type $d_{DF}/t_{DF}=L_c/t_0$, in which $L_c$ is the length of the cable and $t_0$ is the time, measured on the reflectogram, between the amplitude peak corresponding to the impedance discontinuity at the point of injection and the amplitude peak corresponding to the reflection of the signal on the end of the cable.

An analysis device (not represented in FIG. 1) is responsible for analyzing the reflectogram R(t) to deduce therefrom information on the presence and/or location of faults and the possible electrical characteristics of the faults. In particular, the amplitude of a peak in the reflectogram is directly linked to the reflection coefficient of the signal on the impedance discontinuity provoked by the fault.

The detection and location of faults by means of a reflectometry system is of great interest because the earlier a fault is detected, the more possible it is to intervene to correct/repair the fault before the degradation is too great. Thus, monitoring the state of health of a cable allows a reliable use of the cable to be maintained throughout its life.

In the case of a complex cable network comprising many interconnections, the analysis of a reflectogram in order to characterize the presence of faults is more difficult to implement because the junctions between the different cables of the network and the loads at the ends of the cables also create reflections of the signal which can be overlaid on those resulting from a fault. In particular, multiple reflections can exist between several junctions or more generally several singular points of the network. The overlays of multiple reflections of the signal on different singular points of the network can be mutually canceled out, be reinforced or be combined so as to create numerous parasitic peaks in the reflectogram. Moreover, the number of reflections of the signal tends to increase exponentially with the number of cables interconnected in the network. Thus, the complex cable networks produce reflectograms that are very complex to analyze.

In particular, even if a peak characteristic of a fault can be identified in a reflectogram, the location of the fault can be ambiguous because the reflectogram allows only the distance between the fault and the point of injection of the signals be known, and not the branch of the network on which the fault is situated. To illustrate this phenomenon, an example of cable network comprising five branches and two junctions is represented in FIG. 2*a*. The reflectogram associated with this network is illustrated in FIG. 2*b*, considering the injection and the measurement of the signal at the point E of the network. On the reflectogram, a first peak P1 of negative amplitude is identified which corresponds to the first junction J1, followed by a second peak P2 which corresponds to a fault DF. The precise location of this fault DF is not possible because it can be either on the branch L2 at the point DF', or on the branch L3 at the point DF. The other peaks of the reflectogram correspond to direct or multiple reflections on the ends of the different cables, and on the second junction J2.

It can therefore be seen that the methods for monitoring the state of health of a cable network, by reflectometry, are not adequate when the cable network is complex, that is to say that it has many branches and interconnections.

There is therefore a need for a method that allows a fault to be characterized in a cable network of unknown topology.

The invention aims to propose a method and a device that allow the presence, the position, the severity and the nature of a fault to be characterized in a transmission line network of unknown topology. The invention allows information useful to the maintenance of a cable network to be provided.

The invention allows such a result to be obtained through an optimization method using simulated reflectograms of different hypotheses on network topology and nature of the fault and by comparing the simulated reflectograms to a reflectogram measured on the cable network under test.

The invention offers the notable advantage of allowing a more precise characterization of the nature of a detected soft fault, compared to the methods of the prior art.

The subject of the invention is a method for characterizing a fault in a transmission line network, the method comprising the steps of:

obtaining a first measured time reflectogram $R_m$ from a signal previously injected into the cable network, obtaining a second time reflectogram $R_s$ corresponding to the transmission line network in the absence of faults, determining the time difference $R_{ref}$ between the first measured time reflectogram $R_m$ and the second time reflectogram $R_s$, identifying, in said time difference $R_{ref}$, an amplitude peak characterizing the presence of a fault and its time abscissa indicating the position of the fault, simulating a plurality of time reflectogram hypotheses each corresponding to said cable network comprising a fault at said identified position, each hypothesis being associated with a different value of at least one parameter characteristic of the fault, selecting the time reflectogram hypothesis closest to said time difference $R_{ref}$, characterizing the fault from the at least one characteristic parameter associated with the selected hypothesis.

According to a particular aspect of the invention, the parameter characteristic of the fault is taken from among the length of the fault, the value of at least one linear parameter of the fault out of the resistance, the inductance, the capacitance or the conductance, the nature of the fault defined by at least one predominant linear parameter of the fault.

According to a particular aspect of the invention, the value of at least one linear parameter is determined with respect to the value of the same linear parameter of the transmission line.

According to a particular aspect of the invention, the step of determining the time reflectogram hypothesis closest to said time difference comprises at least the comparison of each time reflectogram hypothesis with said time difference at a time window around the amplitude peak characterizing the presence of a fault.

According to a particular aspect of the invention, the comparison is performed by means of a calculation of error between the time reflectogram hypothesis and the time difference.

According to a particular aspect of the invention, the step of determining the time reflectogram hypothesis closest to said time difference is performed by means of an optimization algorithm of the type based on the Newton method or of the genetic algorithm type.

According to a particular aspect of the invention, the second time reflectogram $R_s$ corresponding to the transmission line network in the absence of faults is determined by simulation.

According to a particular aspect of the invention, the second time reflectogram $R_s$ corresponding to the transmission line network in the absence of faults is determined by simulation from the first measured time reflectogram $R_m$ without a priori knowledge of the topology of the line network.

According to a particular aspect of the invention, the step of determining a second time reflectogram $R_s$ corresponding to the transmission line network in the absence of faults comprises the substeps of:
  initially simulating a plurality of cable network hypotheses $H_{i,j}$, then iteratively executing the following steps:
  obtaining, for each simulated cable network hypothesis $H_{i,j}$, an associated simulated time reflectogram $R_{i,j}$,
  evaluating, for each simulated cable network hypothesis $H_{i,j}$, a criterion of error $E(R_{i,j}-R_m)$ between the measured time reflectogram $R_m$ and the simulated time reflectogram $R_{i,j}$,
  applying to said simulated cable networks an optimization algorithm whose function is to produce a plurality of modified cable networks globally exhibiting a reduced error criterion $E(R_{i,j}-R_m)$,
  replacing said simulated cable networks of the preceding iteration with said modified cable networks for the next iteration.

According to a variant embodiment, the method according to the invention comprises a step of displaying the location of the fault in the transmission line network and the at least one parameter characteristic of the fault, on a display device.

According to a variant embodiment, the method according to the invention comprises a preliminary step of injection of the signal into the transmission line network.

Another subject of the invention is a computer program that can be downloaded from a communication network and/or stored on a computer-readable medium and/or executable by a processor, characterized it that it comprises code instructions for the execution of the steps of a method according to the invention, when said program is run on a computer.

Yet another subject of the invention is a device for characterizing a fault in a transmission line network comprising means configured to implement the method according to the invention.

BRIEF DESCRIPTION OF THE DRAWINGS

Other features and advantages of the present invention will become more apparent on reading the following description in relation to the attached drawings which represent:

FIG. 1bis, an example of reflectogram obtained with the reflectometry system of FIG. 1 for a simple cable, FIG. 2a, an example of cable network comprising several branches and junctions, FIG. 2b, an example of time reflectogram obtained for the cable network of FIG. 2a, FIG. 3, a flow diagram describing the steps of the method according to an embodiment of the invention, FIG. 4a, an example of cable network comprising a soft fault, FIGS. 4b, 4c, 4d, three time reflectograms illustrating certain steps of the method according to the invention applied to the network of FIG. 4a, FIG. 5, a flow diagram detailing the steps of implementation of an exemplary embodiment of a step of the method according to the invention.

DETAILED DESCRIPTION

Figure 3:
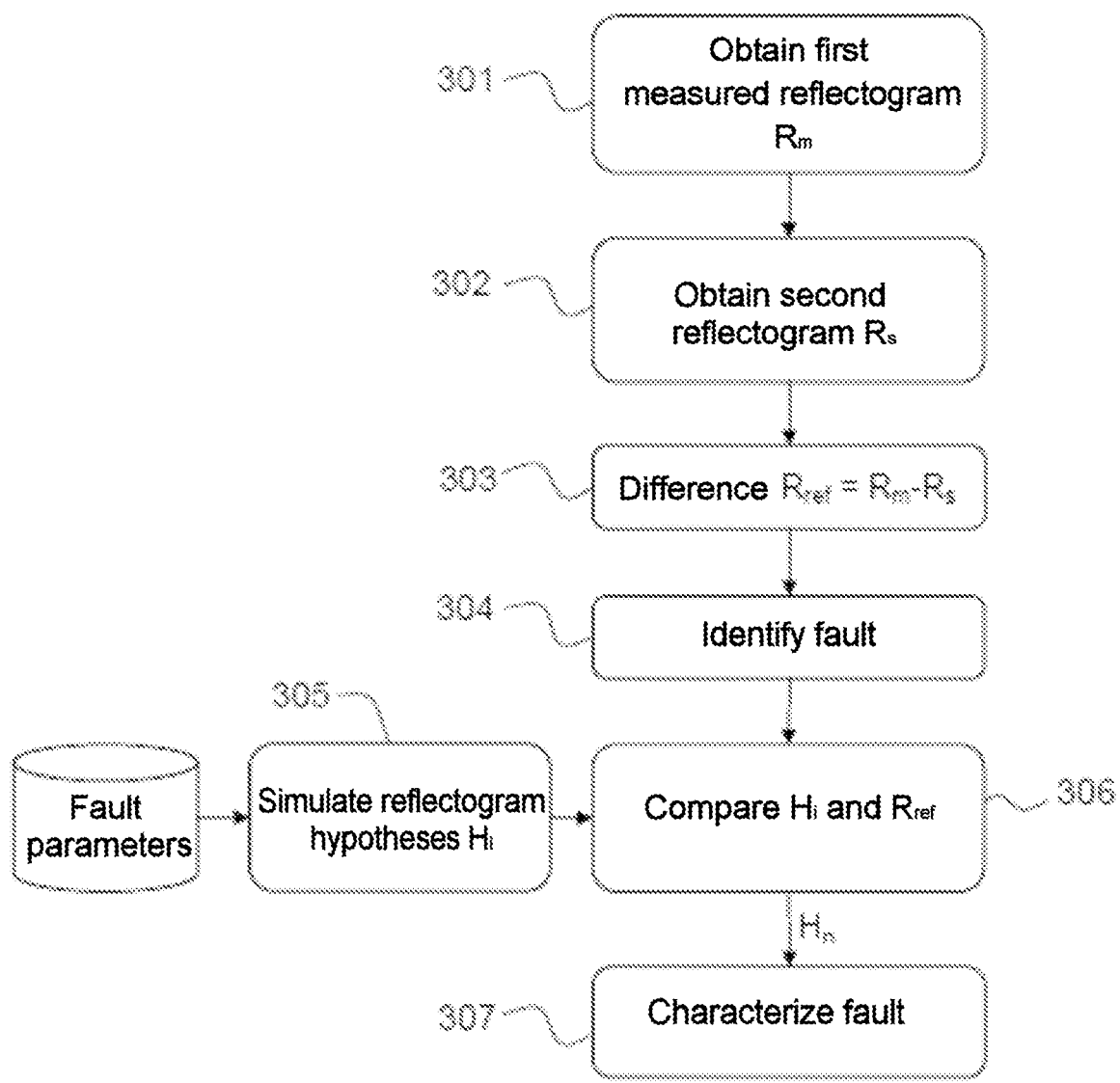

FIG. 3 schematically represents, in a flow diagram, the steps of implementation of the method according to an embodiment of the invention.

In a first step 301 of the method, a time reflectogram $R_m$ is obtained from a reflectometry measurement. As indicated in the preamble, a reflectometry measurement is obtained by injecting a controlled signal at a point of the cable network then by measuring, at the same point or at a different point of the network, the signal which is back-propagated after having undergone multiple reflections on the impedance discontinuities occurring in the cables of the network. The reflectometry measurement can be obtained by means of the device described in FIG. 1 or any other equivalent equipment allowing the same function to be performed. The signal used can be of various kinds, it can be a simple Gaussian signal, a time slot or a pulse or else a more complex signal. Depending on the exact nature of the signal, the time reflectogram $R_m$ is obtained directly by the measurement of the back-propagated signal or else by an intercorrelation calculation between this measurement and a copy of the signal injected into the network. Generally, any signal measurement comprising information relating to the reflections of the signal on the singular points of the network, that is to say the junctions and the loads at the ends of cables, is compatible with the invention. It should be noted that the measurement of the time reflectogram $R_m$ requires access only to a single test port of the network.

Figure 4A:
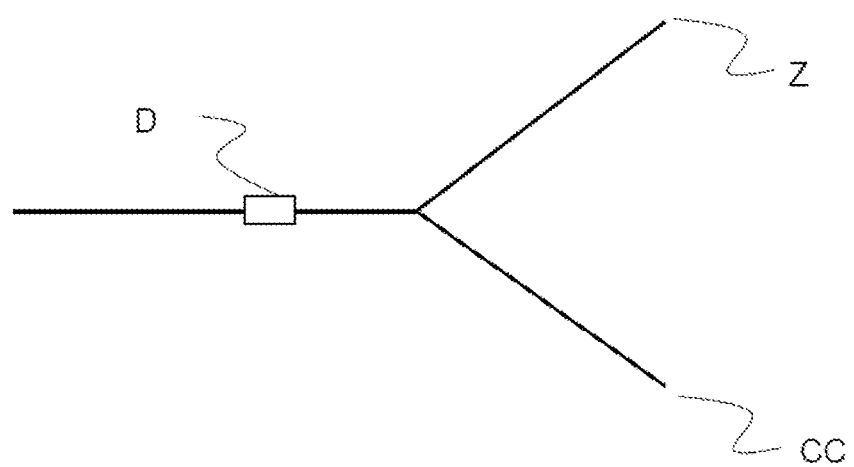
Figure 4B:
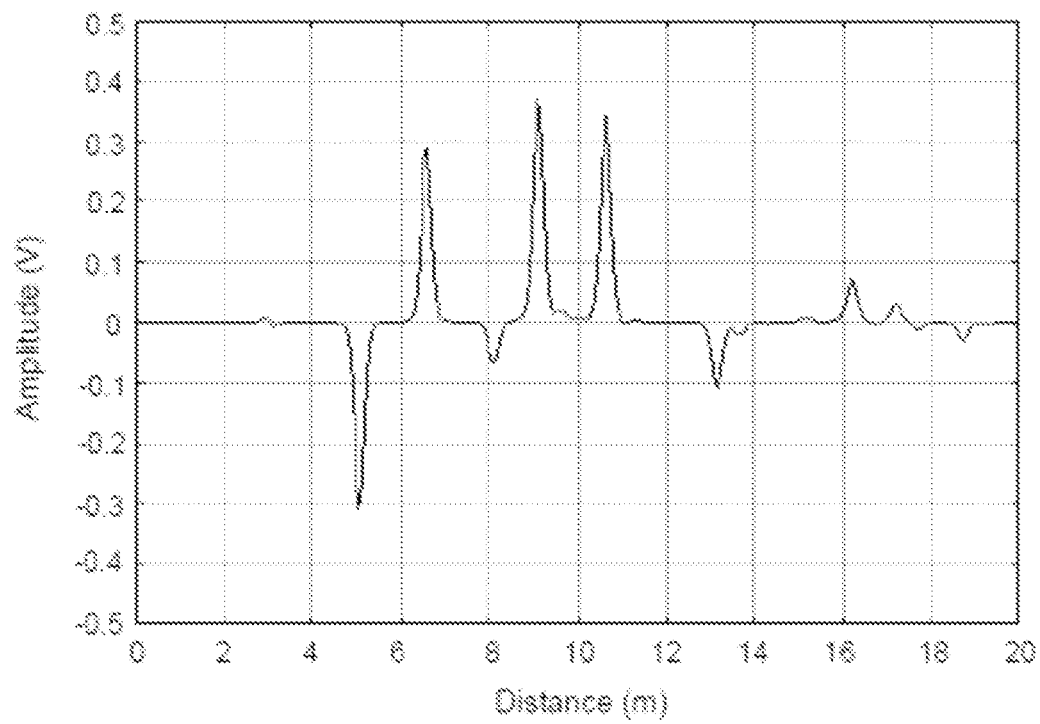

FIG. 4b illustrates an example of time reflectogram $R_m$ measured for an exemplary network described in FIG. 4a. The network is composed of 3 branches linked to a junction. The signal is injected and measured at the end of the first branch. The second branch is terminated by a load Z and the third branch is terminated by a short circuit CC. A soft fault D is situated on the first branch.

In a second step 302 of the method, a second time reflectogram $R_s$ is determined, this reflectogram corresponding to the healthy cable network, that is to say with no hard faults.

According to a first variant of the step 302, the second time reflectogram $R_s$ is determined beforehand, upon the installation of the cable network, when the latter is healthy, that is to say without faults, in order to have a reference. In this case, the second time reflectogram $R_s$ is determined by a reflectometry measurement identical to that described in the first step 301.

However, it is not always possible to perform a measurement by initial reflectometry upon the installation of the cable network or this measurement is not always available at the moment when a maintenance diagnosis of the network is desired.

That is why, according to a second variant of the step 302, the second time reflectogram $R_s$ is determined by simulation from the a priori knowledge of the topology of the cable network. The simulation is performed, for example, by applying a digital model of the propagation of the signal through the cables of the simulated network. In particular, this model takes account of the reflection coefficients and the transmission coefficients on each junction or each load that the simulated network includes. The person skilled in the art can use his or her general knowledge on the propagation of the waves to determine a simulated reflectogram, notably based on the telegrapher's equations which allow the trend of the voltage and of the current on an electrical line to be described as a function of distance and time.

$$\frac{\partial v(x,t)}{\partial x} = -Ri(x,t) - L\frac{\partial i(x,t)}{\partial t} \quad (1)$$

$$\frac{\partial i(x,t)}{\partial x} = -Gv(x,t) - C\frac{\partial v(x,t)}{\partial t} \quad (2)$$

The parameters R,L,C,G correspond respectively to the resistance, to the inductance, to the capacitance and to the conductance of the line.

In a third variant of the step 302, when the topology of the network is not a priori known, the second time reflectogram $R_s$ is simulated, from the first measured time reflectogram $R_m$ by applying an optimization algorithm of the type described in the French patent application from the applicant filed under the number FR 1757650.

This third variant is described in more detail in an appendix to the description.

Figure 4C:
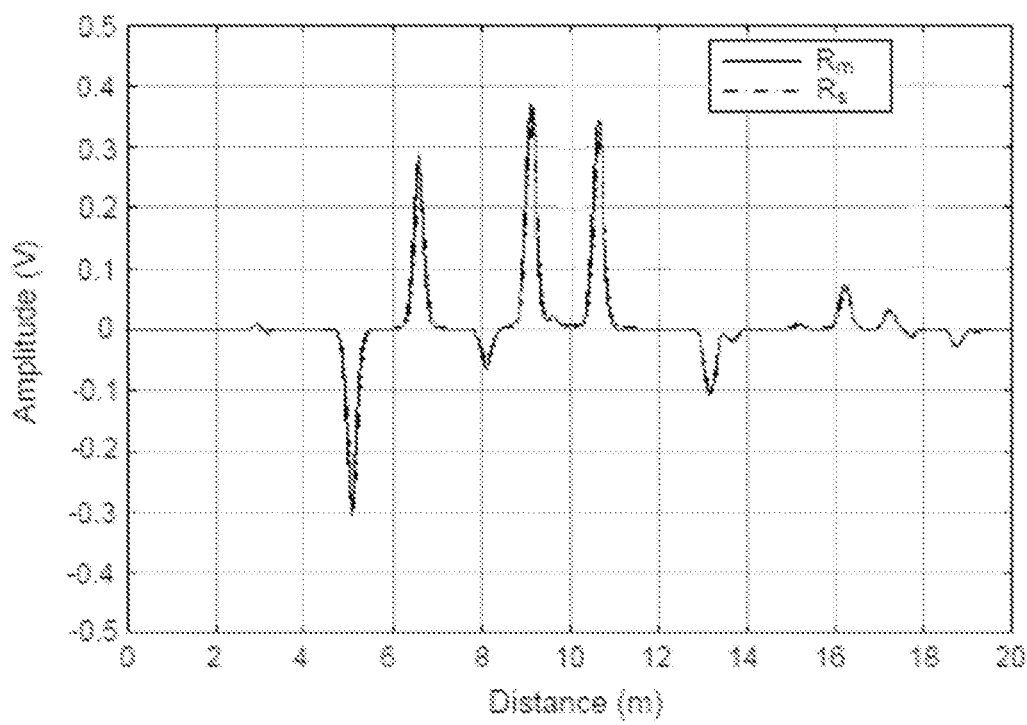

FIG. 4c represents, on one and the same time diagram, the first measured time reflectogram $R_m$ and the second time reflectogram $R_s$ obtained by simulation.

In a next step 303, the point-to-point time difference between the first measured time reflectogram $R_m$ and the second time reflectogram $R_s$ is determined in order to produce a reflectogram in which only the amplitude peaks corresponding to soft faults appear. Indeed, the aim of the step 303 is to eliminate from the reflectogram obtained all the amplitude peaks corresponding to the reflections of the signal on junctions or ends of the cables of the network which are contained in the second time reflectogram $R_s$ characterizing only the network, without faults.

Figure 4D:
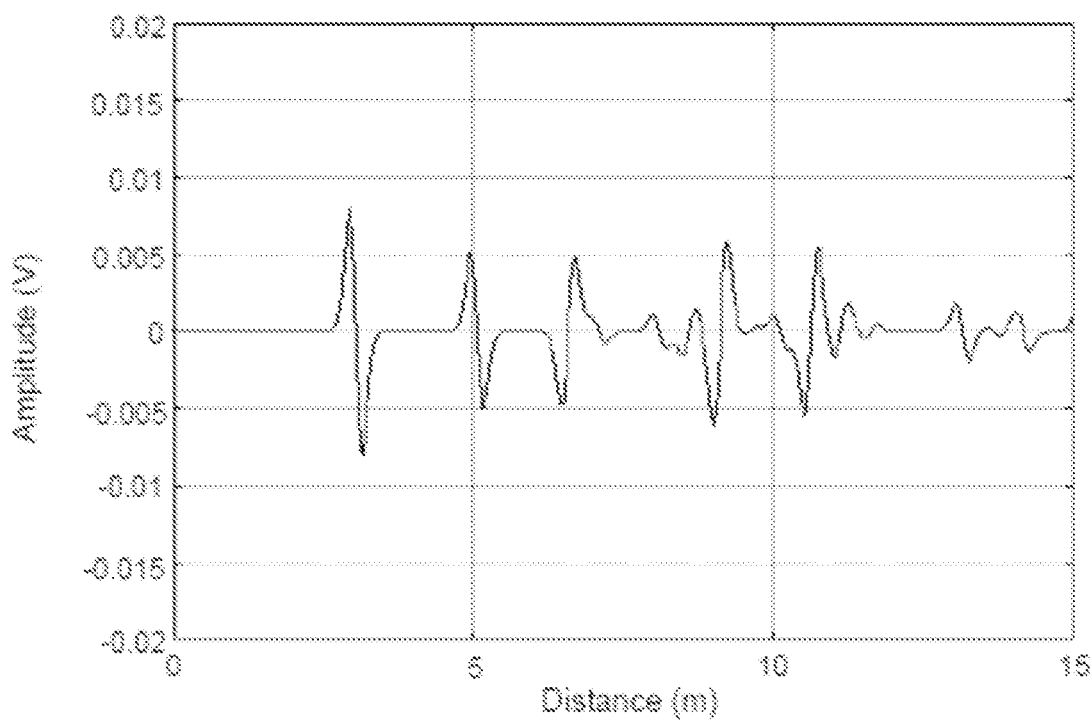

FIG. 4d represents the reflectogram obtained in the step 303. The first amplitude peak A corresponds to the first reflection of the signal on the fault D.

In a next step 304, the presence of a fault is identified on the reflectogram obtained in the step 303, and its position is determined from the time abscissa measurement of the fault.

At the end of this step 304, the presence of a fault has been identified and its position has been able to be estimated in the network from the difference calculated in the step 303 or, more generally, from the comparison between, on the one hand, the first measured reflectogram $R_m$ which comprises reflections of the signal on all the impedance discontinuities of the network, faults included, and, on the other hand, the second reflectogram $R_s$ which comprises only reflections of the signal on junctions and structural terminations of the network.

The aim of the rest of the method is to more accurately characterize the fault detected to determine its degree of severity and/or its propensity to degrade to a major fault and at what speed.

In the next step 305, several fault hypotheses are determined, each hypothesis being defined by at least one parameter out of the length of the fault, the value of each linear parameter of the fault and the nature of the fault, that is to say its predominant linear parameter.

The value of each linear parameter can be expressed as a relative value with respect to the value of the same linear parameter of the transmission line on which the fault is situated. Together, the values of the linear parameters characterizing a fault allow the severity of the fault to be defined.

The length of the fault can be approximated in a first approximation from the time width of the pulse characteristic of the fault on the reflectogram. Then, several hypotheses on widths are taken to refine this value.

There are four linear parameters R,L,C,G that allow a fault to be characterized. The value of each of these parameters or its relative value with respect to the value of the same linear parameter for the transmission line corresponds to the severity of the fault.

Then, the nature of a fault is characterized by its predominant linear parameter.

A linear parameter is predominant if its value is significantly greater than that of the other parameters. For example, if the predominant linear parameter is the resistance R, the fault is of resistive nature. If the predominant linear parameter is the inductance L, the fault is of inductive nature. If the predominant linear parameter is the capacitance C, the fault is of capacitive nature. If the predominant linear parameter is the conductance G, the fault is of conductive nature.

A fault can also have several predominant linear parameters. Generally, a fault is characterized by the respective values of the four linear parameters R,L,C,G.

Knowledge of the nature of a fault allows the rate of degradation of the soft fault into a hard fault to be characterized. For example, a fault of resistive nature exhibits a faster speed of degradation than a fault of capacitive or inductive nature. The speed of degradation depends nevertheless also on the environment of the cable. In particular, the humidity, pressure or vibration conditions also influence the speed of degradation. This information is therefore of significant interest in diagnosing the influence of a detected soft fault on the future maintenance of a cable network.

The step 305 consists, for each fault hypothesis, in simulating a reflectogram of the cable network comprising the fault hypothesis at the position identified in the step 304.

The simulation is based notably on propagation models which give the form of a signal pulse reflected on a fault according to its nature. For example, it is known that a signal pulse reflected on a resistive fault takes the form of a positive pulse. Conversely, a signal pulse reflected on a conductive fault takes the form of a negative pulse. A signal pulse reflected on an inductive fault takes the form of a positive pulse followed by a negative pulse. A signal pulse reflected on a capacitive fault takes the form of a negative pulse followed by a positive pulse.

The value of the linear parameter defines the amplitude of the pulse.

The simulation of a reflectogram for each fault hypothesis takes account of the characteristics of the fault and the complete characteristics of the network whose topology was determined in the step 302.

Modeling of the effect of a soft fault on a reflectogram is performed by considering the soft fault to be an impedance discontinuity which is modeled by a transmission line section of small dimension having R,L,C,G parameters modified with respect to those of the line without fault. Hypotheses are taken for the respective values of each of the parameters R,L,C,G or for the relative values of these parameters with respect to the corresponding parameters of the transmission line on which the fault is situated.

The reflectogram associated with the reflection of the signal on a soft fault is simulated by a digital model which quantifies the propagation of the signal along the transmission lines which make up the network to be analyzed. Such a digital model is obtained, for example, from the telegrapher's equations (1) and (2) introduced previously which allow the trend of the voltage and of the current along a transmission line to be modeled.

One possible modeling method is the "finite difference time domain" calculation method applied to the telegrapher's equations. This method allows the impulse response of a line network, and therefore the propagation of a signal in such a network, to be modeled.

This modeling method is applied similarly to model the reflection of the signal on a line section having R,L,C,G parameters corresponding to the impedance discontinuity generated by the fault.

Next, in a step 306, each simulated reflectogram hypothesis $H_i$ is compared with the time difference $R_{ref}$ determined in the step 303.

The comparison is, for example, performed over a time window bracketing the pulse corresponding to the fault.

The comparison is performed, for example, by means of an optimization algorithm of the genetic algorithm or Newton algorithm type or any other digital optimization method allowing the hypothesis $H_i$ closest to the time difference $R_{ref}$ to be determined.

The comparison criterion used is, for example, a criterion of distance between the two reflectograms $H_i$ and $R_{ref}$, for example a mean square error. The distance or error criterion reflects the proximity or the resemblance between the two reflectograms. It can consist of a simple point-to-point difference between the two reflectograms or a more elaborate distance calculation. For example, the error criterion can be equal to the Euclidian norm or norm 2 of the difference between the two reflectograms. The Euclidian norm is equal to the square root of the sum of the squares of the point-to-point difference values between the two reflectograms. Any other distance or norm can be envisaged.

At the end of the step 306, a single hypothesis $H_p$ is retained and the fault is then characterized 307 from the parameters of the hypothesis retained which comprise at least one parameter out of the length of the fault, the severity of the fault expressed by the value of each linear parameter of the fault which can be expressed with respect to the value of the same linear parameter of the transmission line and the nature of the fault characterized by the predominant linear parameter or parameters.

The method according to the invention can be implemented as a computer program, the method being applied to a reflectometry measurement $R_m$ previously acquired using a standard reflectometry device. The invention can be implemented as a computer program comprising instructions for its execution. The computer program can be stored on a processor-readable storage medium. The reference to a computer program which, when it is executed, performs any one of the functions described previously, is not limited to an application program running on a single host computer. On the contrary, the terms computer program and software are used here in a general sense to refer to any type of computing code (for example, application software, firmware, microcode, or any other form of computer instruction) which can be used to program one or more processors to implement aspects of the techniques described here. The computing means or resources can notably be distributed ("cloud computing"), possibly according to peer-to-peer technologies. The software code can be executed on any appropriate processor (for example, a microprocessor) or processor core or set of processors, whether they are provided in a single computation device or distributed between several computation devices (for example, as possibly accessible in the environment of the device). The executable code of each program allowing the programmable device to implement the processes according to the invention can be stored, for example, on the hard disk or in read-only memory. Generally, the program or programs will be able to be able to be loaded into one of the storage means of the device before being executed. The central unit can control and direct the execution of the instructions or portions of software code of the program or programs according to the invention, instructions which are stored on the hard disk or in the read-only memory or else in the other abovementioned storage elements.

Figure 1:
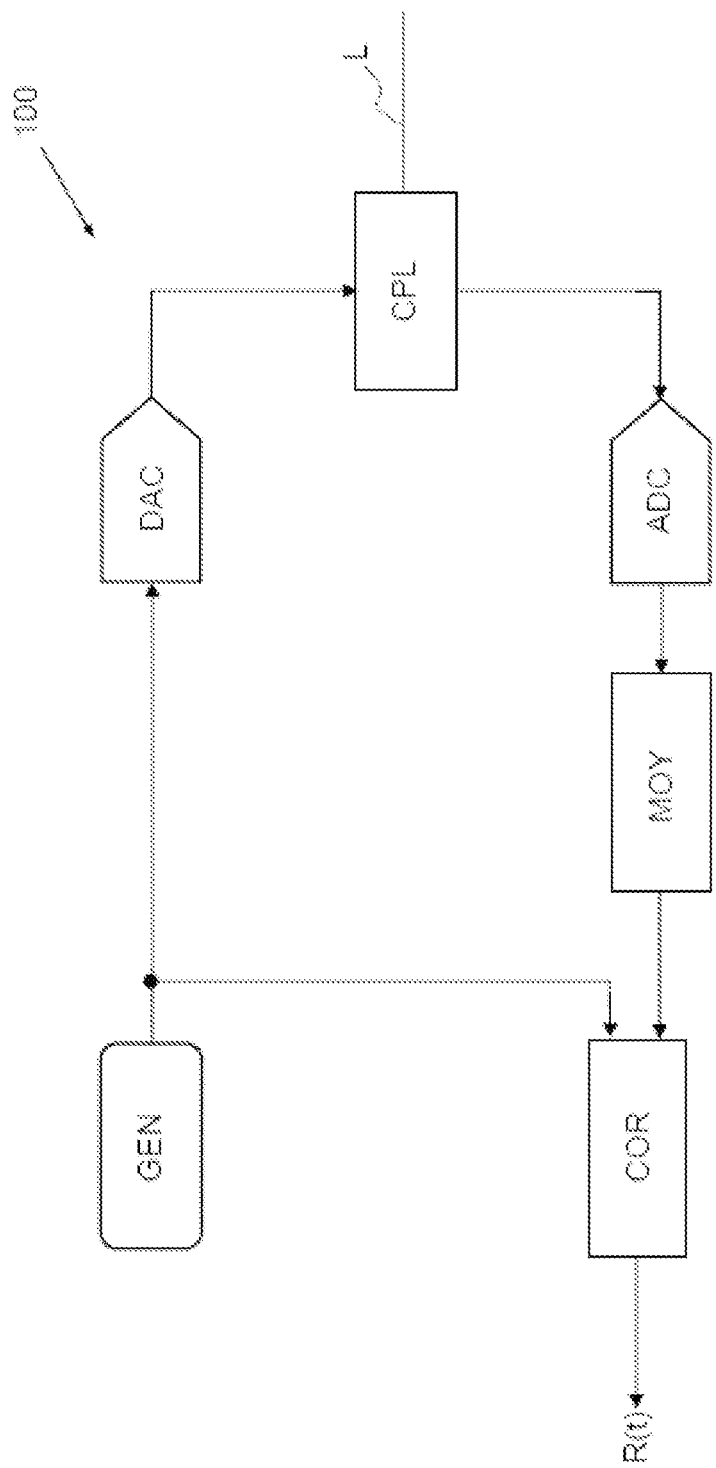
FIG. 1, a diagram of a reflectometry system according to the prior art.
Figure 2A:
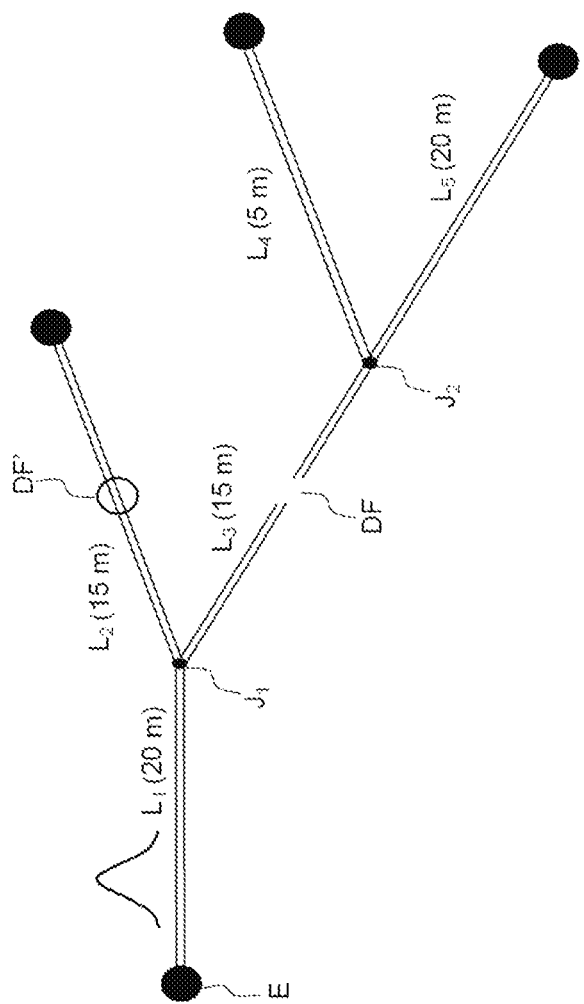
Figure 2B:
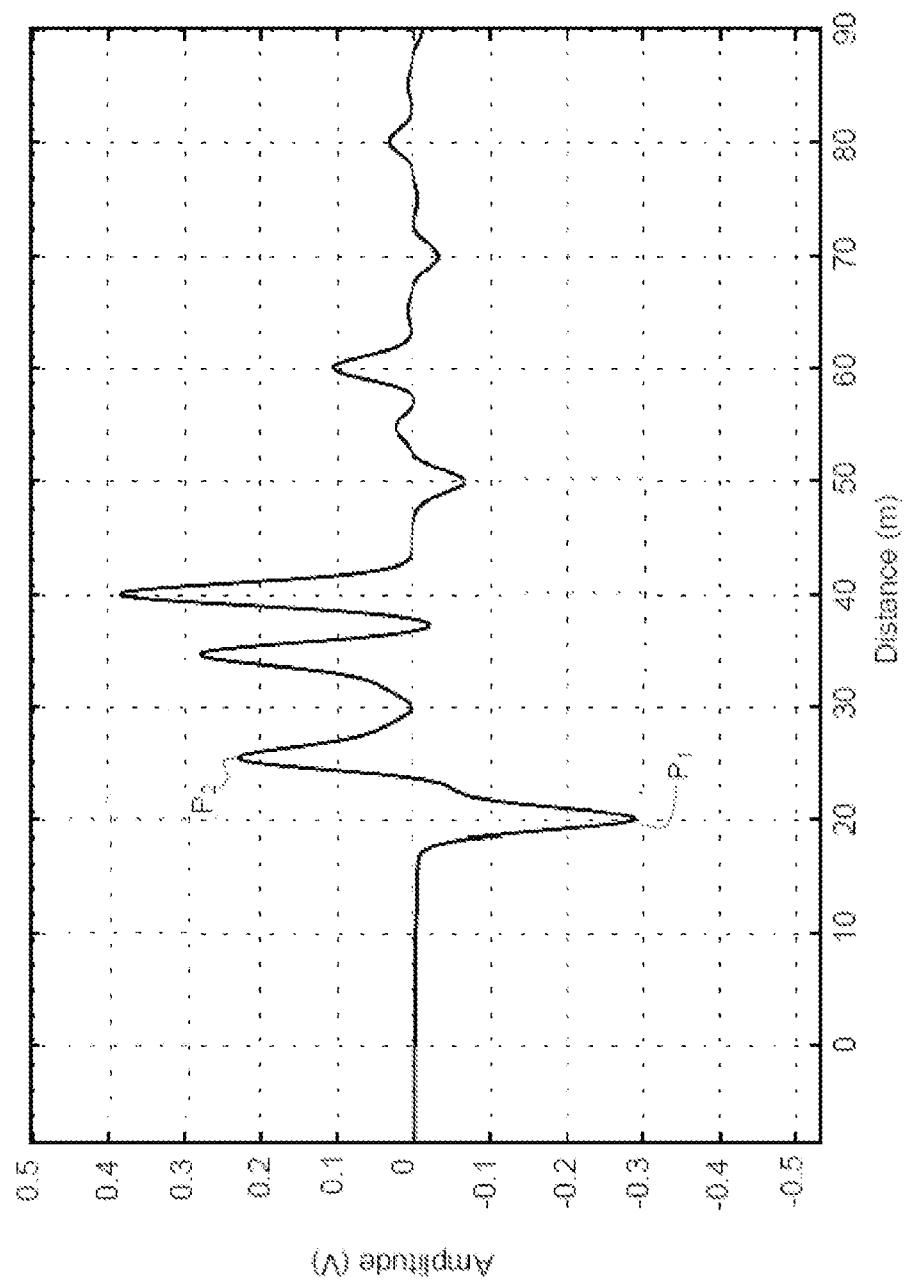

The invention can also be implemented in an embedded device of the type of that of FIG. 1 also comprising at least one calculator and a memory configured to execute the method according to the invention in order to provide, from a measured reflectogram $R_m$, a characterization of the presence of a fault in the cable network to which the device is connected. This characterization comprising at least the position of the fault in the network and one item of information out of the length, the nature and the variation of the value of the predominant linear parameter.

The device can also comprise a means for displaying the results of the method in graph form or in numeric form. For example, the complete topology of the network is displayed with the position of the fault and its detected parameters.

ANNEX

Here, a part of the description of the French patent application from the Applicant filed under the number FR 1757650 is included, describing in detail several embodiments of the step 302 of the method that is the subject of the present invention. The person skilled in the art can refer to this application to implement other variant embodiments of the step 302.

One objective of the step 302 is to provide a reconstruction of the topology of a network that is totally or partially unknown, and of the time reflectogram associated with this network. The information supplied by this step comprises, for example, the number of junctions or connection points of the network, the number of branches or cable sections connected at each junction, the length of each branch and the characteristic impedance of each branch and the value of the load impedance at the end of the branch, that is to say at the end of a cable which is not linked to another cable. The step 302 can provide all such information in order to produce a complete reconstruction of the topology of a network or provide only some of this information. The quantity and the type of information characterizing the topology of a network is a parameter of the invention which is specified by a user.

Figure 5:
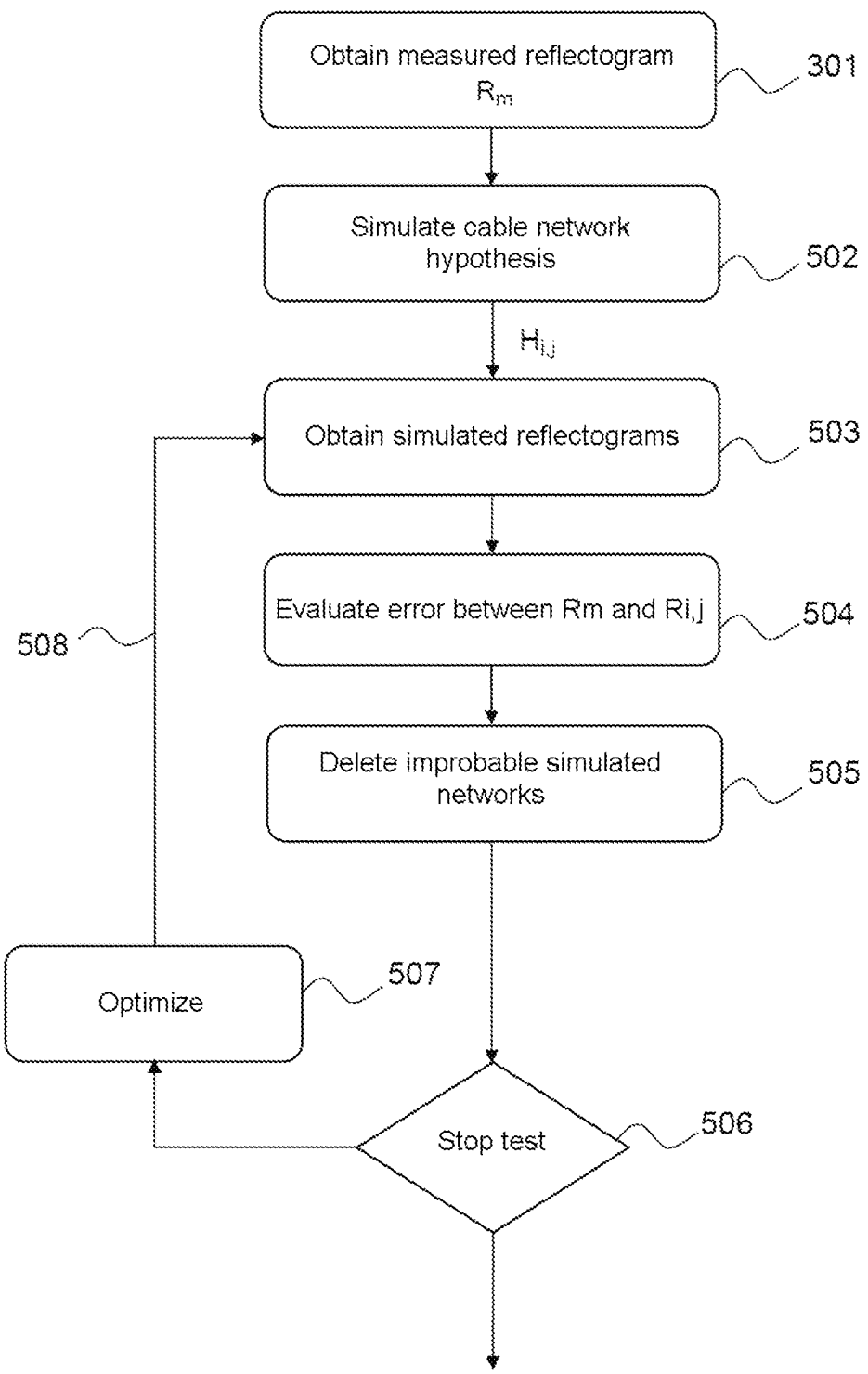

FIG. 5 schematically represents, on a flow diagram, the steps of implementation of an exemplary embodiment of the step 302.

The first step 301 of the method described in FIG. 5 is identical to the first step of the method of FIG. 3 and consists in determining a time reflectogram $R_m$ is obtained from a reflectometry measurement.

In a second step 502, several possible cable network topology hypotheses are simulated taking into account global constraints on the network to be reconstructed, for example the maximum and minimum numbers of branches and of junctions that the network can include, but also limits on the numeric values of the impedances and the lengths of the branches.

The network reconstruction parameters are of two kinds. On the one hand, there are the structural parameters of the topology of a network that are the number of junctions and the number of branches connected at each junction. On the other hand, there are also the numeric parameters of the topology that are the lengths of the branches, the values of the characteristic impedances of the branches and the values of the terminal load impedances of each end of the network.

Altogether, the simulated network hypotheses have to cover all the possible structural topology parameters and have to include several numeric parameter hypotheses for each structural hypothesis.

One exhaustive possibility consists in simulating all the values of numeric parameters and all the structural parameters in order to simulate all the possible hypotheses.

Hereinbelow, $H_{i,j}$ denotes a simulated network hypothesis with i being an index indexing a structural parameter hypothesis and j an index indexing a numeric parameter hypothesis. The index i varies from 1 to $N_{st}$ in which $N_{st}$ is the number of possible structural parameter hypotheses. The index j varies within a substep of the set of possible numeric parameter hypotheses, this substep being at most equal to the total set of the numeric parameter hypotheses.

Next, for each simulated topology hypothesis, a simulated time reflectogram 503 associated with this topology is determined. For that, the same signal as that used to obtain the measured reflectogram $R_m$ and the same conditions of injection of the signal and of measurement of the back-propagated signal are considered. The back-propagated signal is simulated, for example, by applying a numerical model of the propagation of the signal through the cables of the simulated network. In particular, this model takes account of the reflection coefficients and the transmission coefficients on each junction or each load that the simulated network includes. The person skilled in the art can use his or her general knowledge concerning the propagation of the waves to determine a simulated reflectogram, notably based on the telegrapher's equations which allow the trend of the voltage and the current on an electrical line to be described as a function of distance and time.

$$\frac{\partial v(x, t)}{\partial x} = -Ri(x, t) - L\frac{\partial i(x, t)}{\partial t} \quad (1)$$

$$\frac{\partial i(x, t)}{\partial x} = -Gv(x, t) - C\frac{\partial v(x, t)}{\partial t} \quad (2)$$

The parameters R,L,C,G correspond respectively to the resistance, to the inductance, to the capacitance and to the conductance of the line.

At the end of step 503, several simulated reflectograms $R_{i,j}$ are obtained corresponding to the hypotheses $H_{i,j}$.

In the next step 504, for each simulated topology hypothesis, an error criterion is calculated between the measured reflectogram $R_m$ obtained in the step 301 and the reflectogram $R_{i,j}$ of the simulated network. The error criterion reflects the proximity or the resemblance between the two reflectograms. It can consist of a simple point-to-point difference between the two reflectograms or a more elaborate distance calculation. For example, the error criterion can be equal to the Euclidian norm or norm 2 of the difference between the two reflectograms. The Euclidian norm is equal to the square root of the sum of the squares of the point-to-point difference values between the two reflectograms. Any other distance or norm can be envisaged. The error calculation can also include weightings in order to prioritize certain time values over others.

In the step 505, the structural parameter hypotheses which exhibit a high error criterion are eliminated. In other words, at least one index $i_0$ out of the indexes indexing the structural parameter hypotheses is selected, and all the hypotheses $H_{i_0,j}$ are eliminated.

For that, each error criterion calculated in the step 503 is compared to a first error threshold whose value is a parameter set so as to eliminate significant errors which reflect an excessive difference between the measured reflectogram and the simulated reflectogram. Another possibility is to set a percentage or a number of simulated network hypotheses to be eliminated. For example, a single structural parameter hypothesis (the least likely) is eliminated on each iteration. If several numeric hypotheses (index j) are available for each structural hypothesis (index i), a representative error criterion can be assigned to the set of the numeric hypotheses for a structural hypothesis, for example by calculating an average.

In another variant embodiment, the hypothesis or hypotheses exhibiting the highest error criterion or criteria independently of the indexes i,j are eliminated.

The step 505 allows the topologies whose structural parameters are improbable to be eliminated.

On the first iteration of the method, a genetic optimization algorithm 507 is then applied to the simulated networks remaining after the step 505. The genetic algorithm is applied in parallel to each group of hypotheses having the same structural parameters but different numeric parameters.

The genetic algorithm modifies the simulated networks and the modified simulated networks are used as starting point of a next iteration of the method. In other words, on each new iteration, the simulated networks used as input for the step 504 on the preceding iteration are replaced 508 with the simulated networks modified by the genetic algorithm 507. In this first embodiment of the invention, the modifications made to the simulated networks concern only the numeric parameters of the network topologies, that is to say the lengths of branches, the characteristic impedance values of the branches and the values of the cable end load impedances.

An example of genetic algorithm is described in the reference "genetic algorithms", Selvaraj Ramkumar, Apr. 26, 2007. This is an optimization algorithm of metaheuristic type. It consists, on each iteration of the method, in modifying a part of the simulated networks by crossover and/or by mutation. According to the terminology employed for the genetic algorithms, a crossover and a mutation are applied to individuals. An individual corresponds to a simulated network which is represented, in this first embodiment, by a model vector which comprises the different numeric parameters of a topology, that is to say the lengths of the different branches of the network, the values of the characteristic impedances of the different branches of the network and the values of the impedances of the terminal loads of each free end of a branch. A crossover is applied to two parent individuals to produce a child individual. The child individual is a modified simulated network which is obtained by effecting a combination between the parent individuals. The combination is, for example, a linear combination weighted as a function of respective weights assigned to the two parent individuals. The linear combination operation is applied to at least one of the numeric parameters of the topology of a simulated network. The weight associated with an individual is directly linked to the error calculated in the step 504. Thus, an individual exhibiting a low error criterion will be assigned a higher weight than an individual exhibiting a high error criterion. At the output of the step 507, the number of modified individuals is identical to the number of individuals at the input of the step 507. The individuals modified by crossover are each obtained from the crossover of two parent individuals. The parent individuals to which a crossover is applied are, for example, drawn randomly from among the individuals present at the input of the step 507. The random draw can be uniform or it can be non-uniform. In this second case, the individuals exhibiting a high weight have a higher probability of being selected for a crossover operation. In addition, when two individuals are selected to be crossed, their respective weights can also be used to weight the crossover of the values of their respective model vectors.

The modified networks obtained at the output of the genetic algorithm 507 replace 508, on the next iteration, the simulated networks of the preceding iteration and the method loops back to the step 504.

The optimization step 507 allows the numeric parameters of the topology hypotheses to evolve to the most likely parameters.

From the second iteration of the method, a test to stop the method 506 is applied after the step 505. If at least one simulated network exhibits an error criterion below a second predetermined threshold, then this simulated network is retained as the most probable. If several simulated networks satisfy the stop test 506, the method provides several solutions. These solutions can then be discriminated by using a partial knowledge of the real network. The second threshold of the stop test 506 is a parameter of the invention. It can be set by estimating the level of proximity between two reflectograms from which it can be considered that the two networks associated with these two reflectograms are identical. The second threshold can notably be set by simulation. Alternatively, the stop test can also consist in stopping the method after a certain time and in retaining the simulated networks remaining at the end of the step 505 or in retaining only the simulated network exhibiting the lowest error criterion.

The method described in FIG. 5 allows the topology of an unknown network, that is to say both the structural parameters and the numeric parameters, to be completely reconstructed.

The simulated network or networks retained at the end of the method can be displayed on a screen or any other equivalent interface to be viewed by a user.

The simulated reflectogram $R_s$ corresponding to the network topology retained in the step 505 is produced at the output of the step 302 of the method that is the subject of the invention described in FIG. 3. This reflectogram corresponds to that of a "healthy" network, that is to say one without faults.

In a variant embodiment, the genetic optimization algorithm is replaced by an optimization algorithm based on a Newton algorithm as described in the publication "R. Fletcher, "Practical methods of optimization", John Wiley & Sons, 2013".

The invention claimed is:

1. A computer implemented method for characterizing a fault in a transmission line network, the method comprising the steps of:
    obtaining a first measured time reflectogram $R_m$ from a signal previously injected into the cable network,
    obtaining a second time reflectogram $R_s$ corresponding to the transmission line network in the absence of faults,
    determining a time difference $R_{ref}$ between the first measured time reflectogram $R_m$ and the second time reflectogram $R_s$,
    identifying in said time difference $R_{ref}$ an amplitude peak characterizing the presence of a fault and its time abscissa indicating the position of the fault, simulating a plurality of time reflectogram hypotheses each corresponding to said cable network comprising a fault at said identified position, each hypothesis being associated with a different value of at least one parameter characteristic of the fault,
    comparing the simulated time reflectogram hypothesis with said time difference $R_{ref}$ and selecting the simulated time reflectogram hypothesis that is closest to said time difference $R_{ref}$, and
    characterizing the fault from the at least one characteristic parameter associated with the selected reflectogram hypothesis.

2. The computer implemented method for characterizing the fault as claimed in claim 1, wherein the parameter characteristic of the fault is taken from among:
    the length of the fault,
    the value of at least one linear parameter of the fault out of the resistance, the inductance, the capacitance or the conductance, and
    the nature of the fault defined by at least one predominant linear parameter of the fault.

3. The computer implemented method for characterizing the fault as claimed in claim 2, wherein the value of at least one linear parameter is determined with respect to the value of the same linear parameter of the transmission line.

4. The computer implemented method for characterizing the fault as claimed in claim 1, wherein the step of determining the time reflectogram hypothesis closest to said time difference comprises at least the comparison of each time reflectogram hypothesis with said time difference over a time window around the amplitude peak characterizing the presence of a fault.

5. The computer implemented method for characterizing the fault as claimed in claim 4, wherein the comparison is performed by means of a calculation of error between the time reflectogram hypothesis and the time difference.

6. The computer implemented method for characterizing the fault as claimed in claim 1, wherein the step of determining the time reflectogram hypothesis closest to said time difference is performed by means of an optimization algorithm of the type based on the Newton method or of the genetic algorithm type.

7. The computer implemented method for characterizing the fault as claimed in claim 1, wherein the second time reflectogram $R_s$ corresponding to the transmission line network in the absence of faults is determined by simulation.

8. The computer implemented method for characterizing the fault as claimed in claim 1, wherein the second time reflectogram $R_s$ corresponding to the transmission line network in the absence of faults is determined by simulation from the first measured time reflectogram $R_m$ with no a priori knowledge of the topology of the line network.

9. The computer implemented method for characterizing the fault as claimed in claim 8, wherein the step of determining a second time reflectogram $R_s$ corresponding to the transmission line network in the absence of faults comprises the substeps of:

initially simulating a plurality of cable network hypotheses ($H_{i,j}$), then iteratively executing the following steps:

obtaining, for each simulated cable network hypothesis ($H_{i,j}$), an associated simulated time reflectogram $R_{i,j}$, evaluating, for each simulated cable network hypothesis ($H_{i,j}$), an error criterion $E(R_{i,j}-R_m)$ between the measured time reflectogram $R_m$ and the simulated time reflectogram $R_{i,j}$, applying to said simulated cable networks an optimization algorithm whose function is to produce a plurality of modified cable networks globally exhibiting a reduced error criterion $E(R_{i,j}-R_m)$, and replacing said simulated cable networks of the preceding iteration with said modified cable networks for the next iteration.

10. The computer implemented method for characterizing the fault as claimed in claim 1, comprising a step of displaying the location of the fault in the transmission line network and the at least one parameter characteristic of the fault, on a display device.

11. The computer implemented method for characterizing the fault as claimed in claim 1, comprising a preliminary step of injection of the signal into the transmission line network.

12. A computer program stored on a non-transitory computer-readable medium comprising code instructions that when run on a computer cause the computer to execute the steps of the computer implemented method as claimed in claim 1.

13. A device for characterizing a fault in a transmission line network comprising means, including a calculator and a memory, configured to implement the computer implemented method as claimed in claim 1.

* * * * *